United States Patent [19]

Val

[11] Patent Number: 4,553,020

[45] Date of Patent: Nov. 12, 1985

[54] ELECTRONIC COMPONENT PACKAGE COMPRISING A MOISTURE-RETENTION ELEMENT

[75] Inventor: Christian Val, St. Remy-les-Chevreuses, France

[73] Assignee: Compagnie d'Informatique Militaire, Spatiale et Aeronautique, Paris, France

[21] Appl. No.: 565,042

[22] Filed: Dec. 23, 1983

[30] Foreign Application Priority Data

Dec. 28, 1982 [FR] France .................... 82 21871

[51] Int. Cl.$^4$ .................... H01L 23/26; H05B 1/00
[52] U.S. Cl. .................... 219/209; 357/78
[58] Field of Search .............. 219/209; 357/78; 34/80, 34/95, 9; 313/512, 547; 174/52 FP

[56] References Cited

U.S. PATENT DOCUMENTS

| | | | |
|---|---|---|---|
| 2,127,121 | 8/1938 | Kelley | 34/80 |
| 2,469,435 | 5/1949 | Hirsch | 34/80 |
| 2,882,244 | 4/1959 | Milton | 219/209 |
| 3,304,623 | 2/1967 | Reiss | 34/80 |
| 3,391,517 | 7/1968 | Lentz | 53/35 |
| 3,586,926 | 6/1971 | Nakamura | 357/78 |
| 4,310,781 | 1/1982 | Steinhage | 313/547 |
| 4,357,557 | 11/1982 | Inohara | 313/512 |
| 4,426,769 | 1/1984 | Grabbe | 357/78 |

FOREIGN PATENT DOCUMENTS

| | | |
|---|---|---|
| 0025647 | 3/1981 | European Pat. Off. . |
| 3112564 | 6/1982 | Fed. Rep. of Germany . |
| 1501878 | 2/1978 | United Kingdom ............... 313/512 |

OTHER PUBLICATIONS

IBM Technical Disclosure Bulletin, vol. 17, No. 10, Mar. 1975, (New York, US), L. S. Goldmann, "Getter to Prevent Corrosion", p. 2879.

Primary Examiner—Roy N. Envall, Jr.
Assistant Examiner—Teresa J. Walberg

[57] ABSTRACT

A hermetically sealed encapsulation package for electronic components and integrated or hybrid electronic circuits has a base on which the component or circuit is mounted in the conventional manner and a cover. In one embodiment, the base includes a layer of a material which is able to retain any water molecules which might remain within the package after sealing or which may result from in-leakage from the surrounding atmosphere.

12 Claims, 5 Drawing Figures

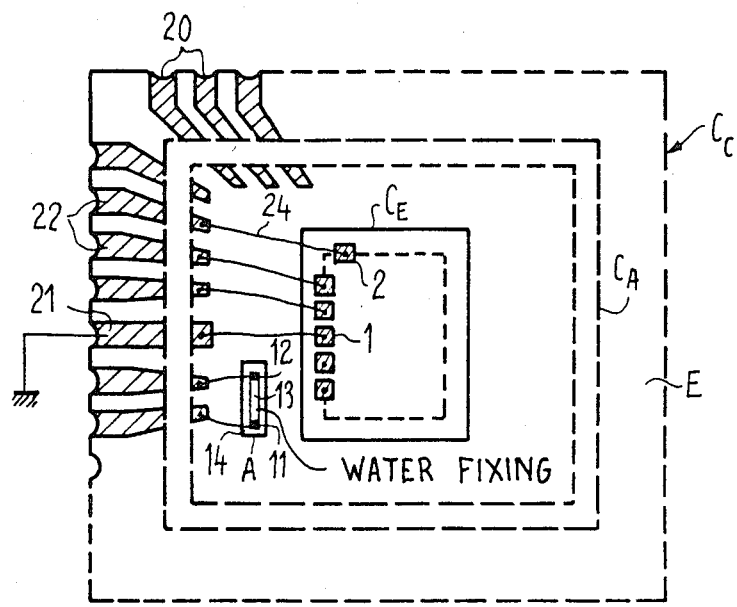
FIG_1
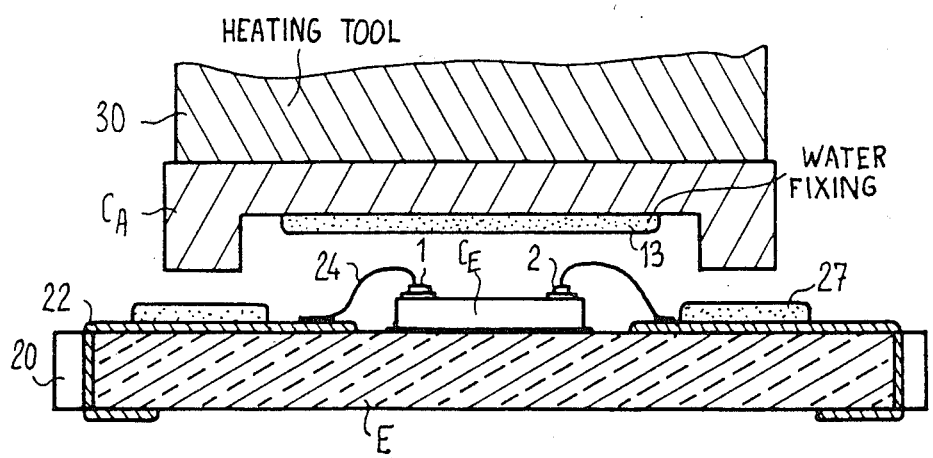
FIG_3

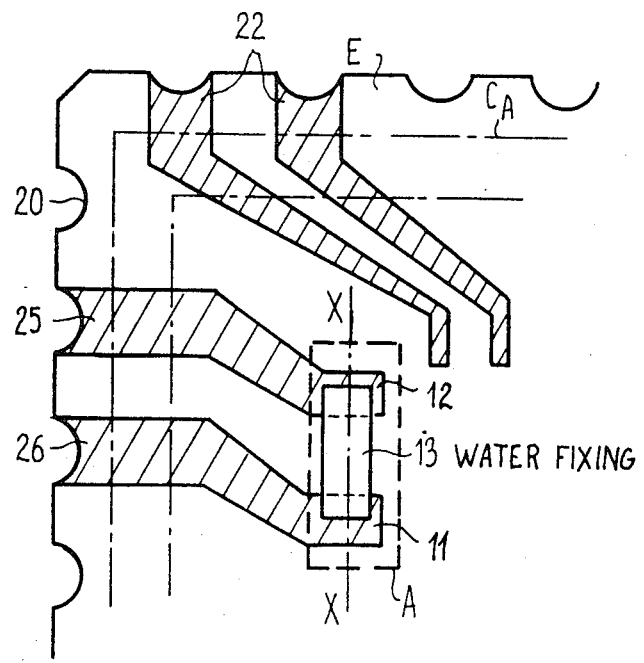
FIG_2-a
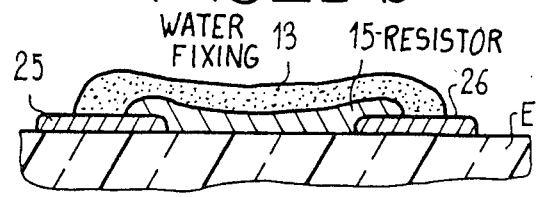
FIG_2-b
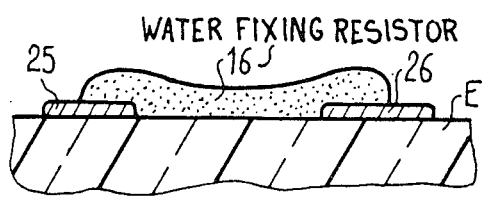
FIG_2-c

ELECTRONIC COMPONENT PACKAGE COMPRISING A MOISTURE-RETENTION ELEMENT

BACKGROUND OF THE INVENTION

1. Field of the Invention

This invention relates to a hermetically sealed case-type package for an electronic component or electronic circuit, which comprises an element for absorption or retention of moisture.

2. Description of the Prior Art

It is known that the contaminant which plays a leading but unfavorable role from the point of view of reliability of a component, of an integrated circuit on a silicon chip, or a hybrid circuit, is the water content of the surrounding atmosphere. In particular, moisture produces corrosion of circuit connection terminals which are usually of aluminum (corrosion resulting from hydrolysis of aluminum). Moisture also permits solubilization of ions, thus increasing the corrosion. This deleterious effect is very marked in the case of integrated circuits, all the more so as large-scale integration is greater and terminals and connections are of correspondingly smaller size.

There are a number of reasons for the presence of water molecules within a case-type package containing an electronic component or circuit. In the first place, if special precautions are not taken at the time of sealing, the package contains ambient air with its usual moisture content or relative humidity (usually in the vicinity of 60 to 70%). In order to reduce this effect, one known expedient consists in removing the water molecules as far as possible before bonding the cover to the base of the package and in carrying out the sealing operation in such a manner as to ensure maximum air-tightness. By way of example, this result is achieved by tin-gold brazing, by glass bonding in a dry atmosphere such as nitrogen at less than 2 or 3 ppm of $H_2O$. However, even under these conditions, water molecules remain within the package and, in addition, the package still exhibits in-leakage. At the time of temperature variations to which packages are usually subjected, a pumping effect occurs through the leak locations. Thus in the cold state, the reduced internal pressure causes outside air to be admitted into the package at ambient humidity. The water molecules thus admitted are at least partially retained chemically (absorbed) or physically (adsorbed) by the elements placed within the package (the circuit, the aluminum, the glass elements used for passivation, and so on). At the time of a temperature rise, the gas discharged to the exterior will therefore contain a smaller quantity of water molecules than the gas initially admitted. It is therefore apparent that the number of water molecules tends to increase within the interior of the package.

There also exist internal sources which produce an increase in humidity within the package and which are of two different types:

in one case, the water molecules which are adsorbed and absorbed by the circuit and the package components will be released during the lifetime of the component. In order to overcome this disadvantage, it is customary practice to carry out degassing prior to encapsulation at a temperature in the vicinity of 150° C. This temperature, however, is too low. It is in fact known that OH groups may still be present at a temperature of over 1000° C.;

in the other case, generation of water molecules takes place within the package during the service life of the package and is caused in particular by chemical recombination of OH groups and protons, by devitrification reactions within the packages containing glass in the case of passivation layers of printed circuits, and so on.

One known solution to this problem of humidity consists in incorporating an electronic circuit for detecting humidity and delivering an alarm signal when the humidity within the package exceeds a predetermined limit. When the alarm threshold is reached, the component is considered as no longer serviceable and is replaced. It is therefore apparent that this is a costly solution on two counts: firstly because it entails the need to incorporate a detector circuit within the package and secondly because it does not prevent the service life of the component from being limited by the problem of humidity.

Another known solution consists in incorporating in the package a material which is capable of retaining the water molecules. The effectiveness of this solution is related to the absorption capacity of the material. Thus, as explained earlier, the package not only exhibits in-leakage but there also exist internal sources of humidity. After a certain period of operation, the material is consequently no longer capable of retaining newly-arrived or newly formed water molecules and the well-known disadvantages reappear.

SUMMARY OF THE INVENTION

The aim of this invention is to provide a package which makes it possible to overcome the above-mentioned drawbacks by incorporating in the package a device which is capable of retaining water molecules as they enter the package or as they form within the interior of the package throughout the lifetime of the component, together with means for heating said device, for degassing purposes. In one embodiment, this device comprises a material including a metal which reacts with water and is thus capable of retaining the water molecules; said heating means are periodically used for diffusing the atoms of this metal towards the surface which is in contact with the atmosphere of the package, thus renewing its moisture-retaining capacity.

According to the invention, there is provided a package for an electronic component, comprising a base for receiving said component and a cover placed over said component and fixed on said base in an air-tight manner, an element which has the function of retaining water molecules, positioned within the interior of said package, and means for heating said element.

It is clear from the foregoing that the device in accordance with the invention is of relatively simple design and also makes it possible to extend the useful life of the component. Since the water molecules are in fact retained as they form within a material placed for this purpose, they are in no way liable to produce the damaging effects mentioned earlier.

BRIEF DESCRIPTION OF THE DRAWINGS

Other features of the invention will be more apparent upon consideration of the following description and accompanying drawings, wherein:

FIG. 1 is a top view of one embodiment of the package in accordance with the invention;

FIGS. 2a, 2b, and 2c are partial variants of the previous figure, shown respectively in a top view (FIG. 2a) and in cross-sectional views (FIGS. 2b and 2c);

FIG. 3 is a sectional view of another embodiment of the package in accordance with the invention.

In these different figures, the same references serve to designate the same elements and the real scale has not been observed for the sake of enhanced clarity of the description.

DESCRIPTION OF THE PREFERRED EMBODIMENTS

In the overhead view of FIG. 1, there is therefore shown a package which may be of the so-called "chip carrier" type and is designated by the reference $C_C$. This package is composed of a base E of ceramic material, for example, and of a cover $C_A$ of metal or of ceramic material, for example. In the figure, the cover sidewall is shown only in phantom outline on the base E.

An electronic component $C_E$ which, in this example, is an integrated circuit fabricated on a semiconductor chip is deposited on the base E. The component $C_E$ has different connection terminals such as those designated by the reference numerals 1 and 2, the terminals being located at the periphery of the component. The base E is adapted to carry a predetermined number of conductors in the form of metal deposits such as those designated by the reference numerals 21 or 22. These conductors extend to the periphery of the base E. In accordance with well-known practice, the conductive deposits in this type of package extend within half-bores 20 formed in the edge face of the base and terminate on the underface of the base, on which they constitute the output connections of the package. Finally, the connection terminals (1, 2) of the component $C_E$ are connected to the base conductors (21, 22) by means of leads such as the lead 24. There is also shown by way of example one of the conductors (21) of the base which is connected to ground.

In accordance with the invention, the base also carries a component A comprising an element 13 which is capable of retaining water molecules.

In the embodiment which is illustrated in FIG. 1, the component A is added to the base. In other words, the element 13 is deposited on a substrate 14 on which the entire component A is constructed, the substrate being deposited on the base E. The element 13 has two connection terminals 11 and 12 connected respectively to two of the conductors such as those designated by the reference 22 which are carried by the base, the terminals 11 and 12 being connected to an electrically conducting element which is not shown in the figure and the function of which is explained in detail below.

The retaining element 13 can consist of any material which is capable of retaining water molecules, this being preferably the case even when the concentration of such molecules is very low. More specifically, the retaining element can consist, for example, of absorbent and porous glass-type material in the zeolite group, also known as "molecular sieve" in vacuum pump technology. In order to provide maximum capacity for retention of water molecules by the element 13, it is preferable to carry out a degassing treatment with a view to ensuring that the number of water molecules carried by the retaining element at the moment of closure of the package is reduced to a minimum. This result is achieved by supplying power to the retaining element 13, for example during the usual operation which consists in degassing the package before bonding the cover to the base. Any known means may be employed for this purpose. In particular, in the embodiment described in the foregoing, it would be possible to make use of a heating resistor connected to the terminals 11 and 12. The moisture-retaining element 13 can also be formed by a material which reacts chemically with water, such as a binary or ternary metal alloy in which at least one alloying element reacts with moisture. Examples worthy of mention include silicon, titanium, zirconium, tantalum, vanadium, aluminum, tin, and so on. A suitable alloy can consist of gold and silicon. In this case, water retention is therefore achieved by chemical reaction.

In this embodiment, in order to renew the capacity of the element 13 for retention of water molecules, the resistor connected to the terminals 11 and 12 also has the function of heating the element 13 at predetermined intervals of time after closure of the package in order to ensure that the atoms of the reactive metal can diffuse towards the surface which is in contact with the atmosphere of the package and through the oxide layer which has already been formed, thus renewing the moisture-retaining capacity of the element 13.

FIG. 2a is a fragmentary top view of an alternative embodiment of the preceding figure. There is again shown in this figure a portion of the base E, the chain-dotted outline of the cover $C_A$, and a few conductors such as the conductor 22 including two conductors which are designated by the reference numerals 25 and 26.

In the alternative embodiment of FIG. 2b, which is a sectional view taken along the axis X—X of FIG. 2a, the resistor is made of resistive material 15 which is deposited directly on the base E and partially on the ends of the conductors 25 and 26 by screen-process deposition, for example. After treatment by baking, this resistive material is coated with the material which constitutes the moisture-retaining element 13 as shown in FIGS. 1, 2a, 2b and which can also be deposited by screen process.

Should the moisture-retaining element 13 be a metal alloy, the resistive material 15 of the alloy is electrically insulated, for example by means of a thin layer of glass (which is not shown in the drawings).

In another embodiment shown in FIG. 2c, again in cross-section taken along the axis X—X, the moisture-retaining material is also conductive, thus dispensing with the resistive layer 15. In this case, the retaining material designated by the reference numeral 16 is also deposited on the base E and on the ends of the conductors 25 and 26. The material 16 can be formed of resistive material such as a silk-screen printing ink having a base of ruthenium oxide, palladium-silver, platinum-silver and the like, the specific surface of which is increased so that the porous material thus produced is capable of retaining water molecules.

It is also possible to dispense with the resistive layer 15 when the moisture-retaining element 13 is a metal alloy. It is only necessary in this case to select the constituents of the alloy in such a manner as to obtain a resistive compound.

In any of the alternative embodiments described in the foregoing, the component A requires only one connection 22 which is left free by the electronic component $C_E$ whilst the second connection can be the ground connection 21.

FIG. 3 is a longitudinal sectional view illustrating another embodiment of the package in accordance with the invention.

In this figure, there is again shown the base E which carries the component $C_E$. This component is connected electrically by means of its terminals 1 and 2 and by means of leads 24 to the conductors 22 of the base E which pass through the half-bores 20. The package further comprises a cover $C_A$ which is intended to be joined to the base E by means of a glass bond 27.

In this embodiment, the moisture-retaining material 13 is carried by the interior of the cover $C_A$ in which it is deposited by screen process, for example.

The advantage of this alternative embodiment over the preceding embodiments is twofold. The first aspect is that a larger quantity of material 13 can be deposited on the cover than on the base itself. The second aspect is that power can be supplied to the material 13 without difficulty prior to bonding of the cover $C_A$ to the base E. It is in fact known that this bonding operation calls for heating of the cover either in a furnace or locally. When the heating operation is performed locally, the cover is heated by a tool 30 to a temperature of the order of 500° C. to 650° C. This operation therefore also has the effect of heating the layer 13 and of producing the desired degassing action.

Where a material is used which reacts chemically with water, there is provided means for heating the fixing material to make its atoms to diffuse towards the surface which is in contact with the atmosphere of the package.

As will readily be apparent, the different embodiments described in the foregoing can be employed cumulatively.

Furthermore, the invention is not limited to the embodiments described earlier. From this it accordingly follows that, although consideration has been given to a package of the flat chip-carrier type containing a single silicon chip, the invention is in fact applicable to any type of package (DIL, CERDIP, and so on) which may be either flat or multilevel, whether the package is intended to be used for a discrete component, for an integrated circuit or for a hybrid circuit. Similarly, the term "component" is used in this patent Application solely for the sake of simplification since it will be understood that this term is applicable to any one of these three elements. It should likewise be noted that, while it has been assumed in the foregoing description that the package is of ceramic or metal, it can also be either partly or entirely made of plastic (base or cover). Furthermore, in order to degas the material which serves to retain water molecules, the necessary power can be supplied by means other than heating. By way of example, such means can consist of exposure to ultraviolet radiation.

What is claimed is:

1. A package for an electronic component, comprising a base for receiving said component and a cover placed over said component and fixed on said base in an air-tight manner, a retaining element which chemically reacts with and retains water molecules, positioned within said package, and also located inside said package, means for heating said element after said tight fixing of said cover.

2. A package according to claim 1, further comprising a substrate positioned on said base, said substrate carrying said retaining element.

3. A package according to claim 1, wherein said retaining element is carried by the base.

4. A package according to claim 1, wherein said retaining element is carried by the cover.

5. A package according to claim 1, wherein said heating means comprise an electrically resistive material in thermal contact with said retaining element, said resistive material being connected to two electric conductors formed on said base in order to provide a connection between the inside and outside of said package.

6. A package according to claim 1, wherein said heating means are formed with said retaining element, said retaining element being further capable of electric current conduction and generation of heat, said retaining element being connected to two electric conductors formed on the base in order to provide a connection between inside and outside of said package.

7. A package according to claim 6, wherein said retaining element is a porous material comprising a silk-screen printing ink and an electrically conductive material.

8. A package according to claim 1, wherein said retaining element comprises zeolite.

9. A package according to claim 1, wherein said retaining element is a metal.

10. A package according to claim 1, wherein said heating means have connecting means extending outside said package, thus enabling said heating means to heat said retaining element after the airtight fixing of said package.

11. A package according to claim 1, further comprising a substrate positioned on said cover, said substrate carrying said retaining element.

12. A package for an electronic component comprising
    (a) a base for receiving said component;
    (b) a cover placed over said component on said base in an airtight manner;
    (c) an element which chemically reacts with and retains water molecules positioned within said package; and also
    (d) within said package means for heating said element;
    (e) said element after reacting with water retains said water, and the heating of said element increases a capacity of said element to react with and retain water.

* * * * *